(12) United States Patent
Rofougaran et al.

(10) Patent No.: US 8,787,997 B2
(45) Date of Patent: *Jul. 22, 2014

(54) METHOD AND SYSTEM FOR A DISTRIBUTED LEAKY WAVE ANTENNA

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

(*) Notice: Subject to any disclaimer, the term of this patent is extended or adjusted under 35 U.S.C. 154(b) by 401 days.

This patent is subject to a terminal disclaimer.

(21) Appl. No.: 12/751,782

(22) Filed: Mar. 31, 2010

(65) Prior Publication Data

US 2010/0311363 A1    Dec. 9, 2010

Related U.S. Application Data

(60) Provisional application No. 61/246,618, filed on Sep. 29, 2009, provisional application No. 61/185,245, filed on Jun. 9, 2009.

(51) Int. Cl.
| | |
|---|---|
| H04M 1/00 | (2006.01) |
| G01S 13/06 | (2006.01) |
| H04B 7/24 | (2006.01) |
| H04B 1/04 | (2006.01) |
| H01Q 13/20 | (2006.01) |
| H01Q 1/22 | (2006.01) |
| H04B 5/00 | (2006.01) |
| H01Q 13/22 | (2006.01) |

(52) U.S. Cl.
CPC . *G01S 13/06* (2013.01); *H04B 7/24* (2013.01); *H04B 1/0458* (2013.01); *H01Q 13/20* (2013.01); *H01Q 1/2283* (2013.01); *H04B 1/04* (2013.01); *H04B 5/0031* (2013.01); *H01Q 13/22* (2013.01)

USPC .......... 455/575.7; 455/550.1; 257/499; 257/635

(58) Field of Classification Search
USPC .......... 455/39, 41.2, 66.1, 550.1, 575.1, 90.2, 455/90.3, 575.7, 128, 129; 257/499, 510, 257/534, 635, 638, 678, 734, 750, 798; 438/106, 800; 716/100, 137
See application file for complete search history.

(56) References Cited

U.S. PATENT DOCUMENTS

| | | | |
|---|---|---|---|
| 3,972,049 A | 7/1976 | Kaloi | |
| 4,078,237 A | 3/1978 | Kaloi | |

(Continued)

OTHER PUBLICATIONS

Iyer et al., "Wireless chip to chip interconnections for multichip modules using leaky wave antennas", Nov. 1993, pp. 2030-2031.

(Continued)

*Primary Examiner* — Andrew Wendell
(74) *Attorney, Agent, or Firm* — Oblon, Spivak, McClelland, Maier & Neustadt, L.L.P.

(57) ABSTRACT

Methods and systems for a distributed leaky wave antenna (LWA) are disclosed and may include communicating RF signals at one or more frequencies via distributed LWAs in a wireless communication device. The distributed LWAs may be integrated in one or more multi-layer support structures. The RF signals may be communicated at the one or more frequencies via a plurality of cavity heights in the distributed LWAs or via a plurality of sections of the distributed LWAs with different partially reflective surfaces. The distributed LWAs may be configured to transmit the RF signals at a desired angle from a surface of the multi-layer support structures. The distributed LWAs may include microstrip or coplanar waveguides where the plurality of cavity heights of the one or more distributed LWAs may be configured based on distances between conductive lines in the waveguides.

20 Claims, 11 Drawing Sheets

(56) References Cited

U.S. PATENT DOCUMENTS

| | | | |
|---|---|---|---|
| 4,701,763 A | 10/1987 | Yamamoto | |
| 5,068,669 A * | 11/1991 | Koert et al. | 343/700 MS |
| 5,138,436 A | 8/1992 | Koepf | |
| 5,300,875 A | 4/1994 | Tuttle | |
| 5,363,075 A | 11/1994 | Fanucchi | |
| 5,387,885 A | 2/1995 | Chi | |
| 5,717,943 A | 2/1998 | Barker | |
| 5,900,843 A | 5/1999 | Lee | |
| 5,912,598 A | 6/1999 | Stones | |
| 5,943,025 A | 8/1999 | Benham | |
| 6,005,520 A | 12/1999 | Nalbandian | |
| 6,037,743 A | 3/2000 | White | |
| 6,127,799 A | 10/2000 | Krishnan | |
| 6,212,431 B1 | 4/2001 | Hahn | |
| 6,285,325 B1 | 9/2001 | Nalbandian | |
| 6,411,824 B1 | 6/2002 | Eidson | |
| 6,470,174 B1 * | 10/2002 | Schefte et al. | 455/90.1 |
| 6,597,323 B2 | 7/2003 | Teshirogi | |
| 6,603,915 B2 | 8/2003 | Glebov | |
| 6,735,630 B1 | 5/2004 | Gelvin | |
| 6,771,935 B1 | 8/2004 | Leggett | |
| 6,841,981 B2 | 1/2005 | Smith | |
| 6,954,236 B1 | 10/2005 | Russell | |
| 7,002,517 B2 | 2/2006 | Noujeim | |
| 7,020,701 B1 | 3/2006 | Gelvin | |
| 7,023,374 B2 | 4/2006 | Jossef | |
| 7,084,823 B2 | 8/2006 | Caimi | |
| 7,233,299 B2 | 6/2007 | Thevenot | |
| 7,253,780 B2 | 8/2007 | Sievenpiper | |
| 7,268,517 B2 | 9/2007 | Rahmel | |
| 7,317,342 B2 | 1/2008 | Saint-Laurent | |
| 7,330,090 B2 | 2/2008 | Itoh | |
| 7,348,928 B2 | 3/2008 | Ma | |
| 7,373,133 B2 | 5/2008 | Mickle | |
| 7,394,288 B1 | 7/2008 | Agarwal | |
| 7,535,958 B2 | 5/2009 | Best | |
| 7,592,957 B2 | 9/2009 | Achour | |
| 7,620,424 B2 * | 11/2009 | Cetiner et al. | 455/562.1 |
| 7,733,265 B2 | 6/2010 | Margomenos | |
| 7,855,696 B2 | 12/2010 | Gummalla | |
| 8,195,103 B2 | 6/2012 | Waheed | |
| 8,242,957 B2 | 8/2012 | Rofougaran | |
| 8,285,231 B2 | 10/2012 | Rofougaran | |
| 8,295,788 B2 | 10/2012 | Rofougaran | |
| 8,299,971 B2 | 10/2012 | Talty | |
| 2002/0000936 A1 | 1/2002 | Sheen | |
| 2002/0005807 A1 * | 1/2002 | Sheen | 343/700 MS |
| 2002/0041256 A1 | 4/2002 | Saitou | |
| 2002/0135568 A1 | 9/2002 | Chen | |
| 2003/0122729 A1 | 7/2003 | Diaz | |
| 2004/0066251 A1 | 4/2004 | Eleftheriades | |
| 2004/0097270 A1 * | 5/2004 | Cha et al. | 455/562.1 |
| 2004/0203944 A1 | 10/2004 | Huomo | |
| 2004/0227668 A1 | 11/2004 | Sievenpiper | |
| 2004/0263378 A1 | 12/2004 | Jossef | |
| 2004/0263408 A1 | 12/2004 | Sievenpiper | |
| 2005/0012667 A1 * | 1/2005 | Noujeim | 343/700 MS |
| 2005/0052283 A1 | 3/2005 | Collins | |
| 2005/0052424 A1 | 3/2005 | Shih | |
| 2005/0116864 A1 | 6/2005 | Mohamadi | |
| 2005/0128155 A1 | 6/2005 | Fukuda | |
| 2005/0134579 A1 | 6/2005 | Hsieh | |
| 2005/0136972 A1 | 6/2005 | Smith | |
| 2006/0066326 A1 | 3/2006 | Slupsky | |
| 2006/0109127 A1 | 5/2006 | Barink | |
| 2006/0125703 A1 | 6/2006 | Ma | |
| 2006/0125713 A1 | 6/2006 | Thevenot | |
| 2006/0281423 A1 | 12/2006 | Caimi | |
| 2007/0171076 A1 | 7/2007 | Stevens | |
| 2007/0190952 A1 | 8/2007 | Waheed | |
| 2007/0273607 A1 | 11/2007 | Chen | |
| 2007/0285248 A1 | 12/2007 | Hamel | |
| 2007/0287403 A1 | 12/2007 | Sjoland | |
| 2008/0068174 A1 | 3/2008 | Al-Mahdawi | |
| 2008/0105966 A1 * | 5/2008 | Beer et al. | 257/690 |
| 2008/0159243 A1 | 7/2008 | Rofougaran | |
| 2008/0179404 A1 * | 7/2008 | Finn | 235/492 |
| 2008/0190356 A1 * | 8/2008 | Bhandari | 117/98 |
| 2008/0231603 A1 | 9/2008 | Parkinson | |
| 2008/0258981 A1 | 10/2008 | Achour | |
| 2008/0278400 A1 | 11/2008 | Lohninger | |
| 2008/0284085 A1 | 11/2008 | Curina | |
| 2008/0316135 A1 | 12/2008 | Hilgers | |
| 2009/0066516 A1 | 3/2009 | Lazo | |
| 2009/0108996 A1 | 4/2009 | Day | |
| 2009/0160612 A1 | 6/2009 | Varpula | |
| 2009/0174609 A1 * | 7/2009 | Sanada | 343/700 MS |
| 2009/0251362 A1 | 10/2009 | Margomenos | |
| 2010/0110943 A2 | 5/2010 | Gummalla | |
| 2010/0222105 A1 * | 9/2010 | Nghiem et al. | 455/558 |
| 2010/0308668 A1 | 12/2010 | Rofougaran | |
| 2010/0308767 A1 | 12/2010 | Rofougaran | |
| 2010/0308885 A1 | 12/2010 | Rofougaran | |
| 2010/0308970 A1 | 12/2010 | Rofougaran | |
| 2010/0308997 A1 | 12/2010 | Rofougaran | |
| 2010/0309040 A1 | 12/2010 | Rofougaran | |
| 2010/0309056 A1 | 12/2010 | Rofougaran | |
| 2010/0309069 A1 | 12/2010 | Rofougaran | |
| 2010/0309071 A1 | 12/2010 | Rofougaran | |
| 2010/0309072 A1 | 12/2010 | Rofougaran | |
| 2010/0309073 A1 * | 12/2010 | Rofougaran et al. | 343/772 |
| 2010/0309074 A1 | 12/2010 | Rofougaran | |
| 2010/0309075 A1 | 12/2010 | Rofougaran | |
| 2010/0309076 A1 | 12/2010 | Rofougaran | |
| 2010/0309077 A1 | 12/2010 | Rofougaran | |
| 2010/0309078 A1 | 12/2010 | Rofougaran | |
| 2010/0309079 A1 | 12/2010 | Rofougaran | |
| 2010/0309824 A1 | 12/2010 | Rofougaran | |
| 2010/0311324 A1 | 12/2010 | Rofougaran | |
| 2010/0311332 A1 | 12/2010 | Roufougaran | |
| 2010/0311333 A1 | 12/2010 | Rofougaran | |
| 2010/0311338 A1 | 12/2010 | Rofougaran | |
| 2010/0311340 A1 | 12/2010 | Rofougaran | |
| 2010/0311355 A1 | 12/2010 | Rofougaran | |
| 2010/0311356 A1 | 12/2010 | Rofougaran | |
| 2010/0311359 A1 | 12/2010 | Rofougaran | |
| 2010/0311363 A1 | 12/2010 | Rofougaran | |
| 2010/0311364 A1 | 12/2010 | Rofougaran | |
| 2010/0311367 A1 | 12/2010 | Rofougaran | |
| 2010/0311368 A1 | 12/2010 | Rofougaran | |
| 2010/0311369 A1 | 12/2010 | Rofougaran | |
| 2010/0311376 A1 | 12/2010 | Rofougaran | |
| 2010/0311379 A1 | 12/2010 | Rofougaran | |
| 2010/0311380 A1 | 12/2010 | Rofougaran | |
| 2010/0311472 A1 | 12/2010 | Rofougaran | |
| 2010/0311493 A1 | 12/2010 | Miller | |
| 2011/0148723 A1 | 6/2011 | Bengtsson | |
| 2012/0062310 A1 * | 3/2012 | Miles | 327/434 |
| 2012/0095531 A1 | 4/2012 | Derbas | |
| 2012/0153731 A9 | 6/2012 | Kirby | |
| 2012/0263256 A1 | 10/2012 | Waheed | |

OTHER PUBLICATIONS

Huang et al., "An Electronically Switchable Leaky Wave Antenna", Nov. 2000, pp. 1769-1772.

Grbic et al., "Leaky CPW-Based Slot Antenna Arrays for Millimeter-Wave Applications", Nov. 2002, pp. 1494-1504.

Floyd et al., "Wireless Interconnects for Clock Distribution", pp. 105-108, Dec. 2002.

Zvolensky et al., "Leaky-Wave antenna based on micro-electromechanical systems-loaded microstrip line", 2011, pp. 357-363.

Feresidis et al., "Flat Plate Millimetre Wave Antenna Based on Partially Reflective FSS", 11$^{th}$ International Conference on Antennas and Propagation, 2001, pp. 33-36.

(56) References Cited

OTHER PUBLICATIONS

Yeo et al., "Novel Design of a High-Gain and Wideband Fabry-Perot Cavity Antenna Using a Tapered AMC Substrate", J Infrared Milli Terahz Waves, (2009) vol. 30, pp. 217-224.

O, K.K. et al., "Silicon Integrated Circuits Incorporating Antennas", IEEE Custom Integrated Circuits Conference, 2006, pp. 473-480.

Sterner et al., "RF MEMS High-Impedance Tuneable Metamaterials for Millimeter-Wave Beam Steering", Micro Electro Mechanical Systems, 2009, pp. 896-899.

Ourir et al., "Electronically Reconfigurable Metamaterial for Compact Directive Cavity Antennas", Electronics Letters, 2007.

Kimoto et al., "On-Chip Wireless Signal Transmission using Silicon Integrated Antennas", Measurement 40, No. 30, (2004): 20.

\* cited by examiner

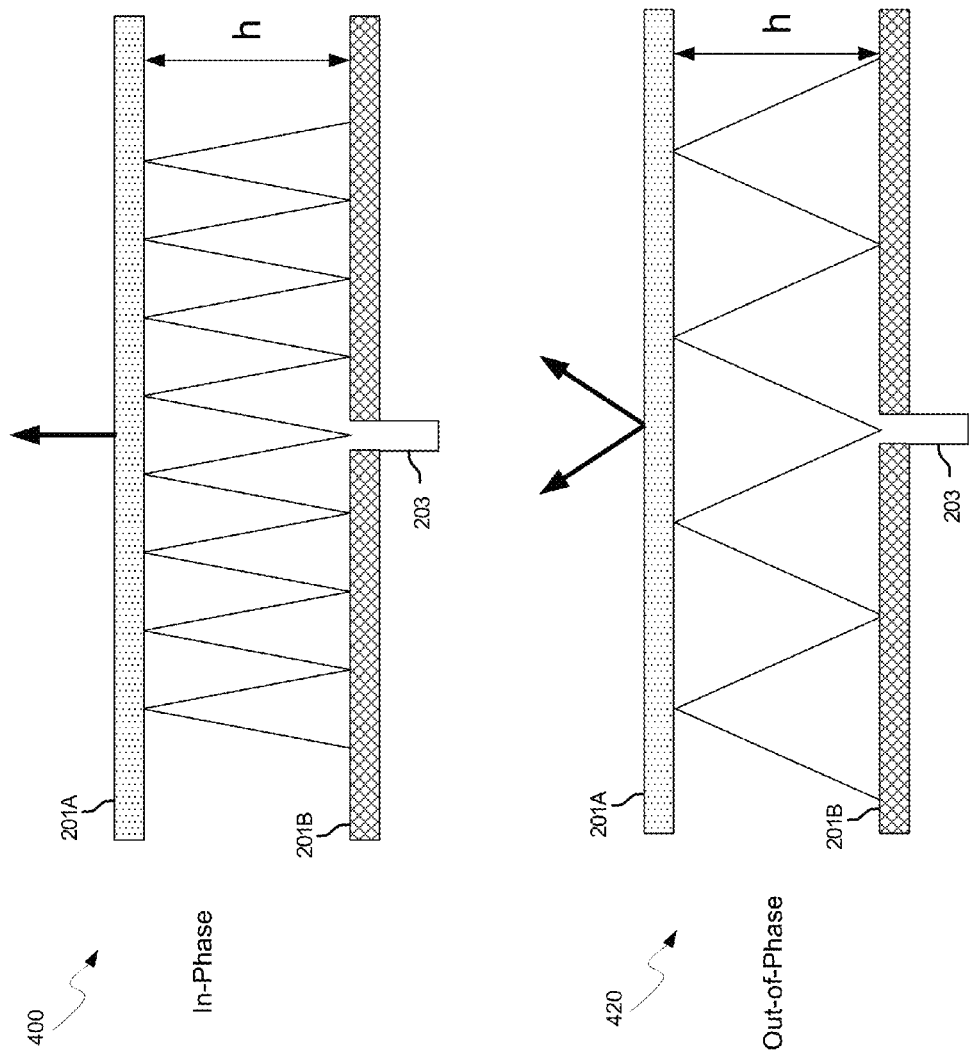

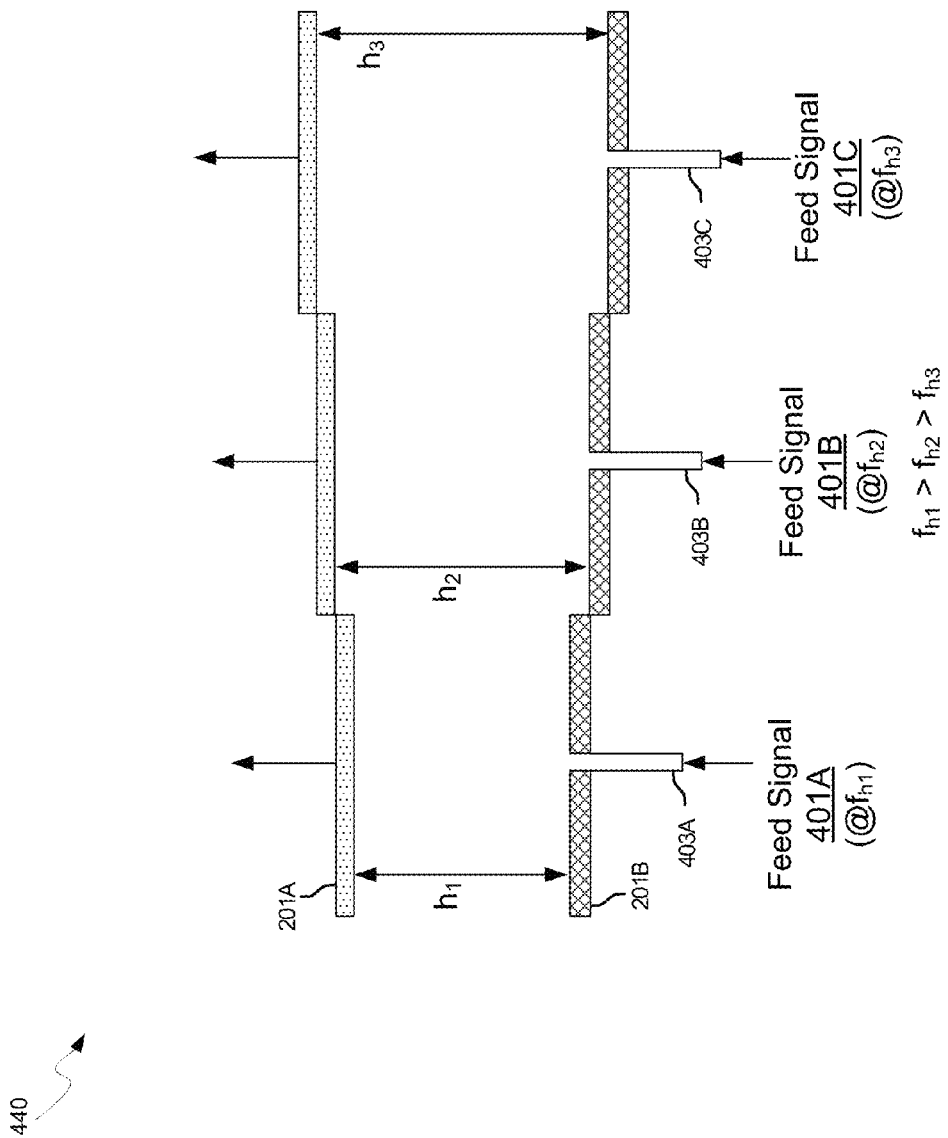

METHOD AND SYSTEM FOR A DISTRIBUTED LEAKY WAVE ANTENNA

CROSS-REFERENCE TO RELATED APPLICATIONS/INCORPORATION BY REFERENCE

This application makes reference to, claims the benefit from, and claims priority to U.S. Provisional Application Ser. No. 61/246,618 filed on Sep. 29, 2009, and U.S. Provisional Application Ser. No. 61/185,245 filed on Jun. 9, 2009.

This application also makes reference to:
U.S. patent application Ser. No. 12/650,212 filed on Dec. 30, 2009;
U.S. patent application Ser. No. 12/650,295 filed on Dec. 30, 2009;
U.S. patent application Ser. No. 12/650,277 filed on Dec. 30, 2009;
U.S. patent application Ser. No. 12/650,192 filed on Dec. 30, 2009;
U.S. patent application Ser. No. 12/650,224 filed on Dec. 30, 2009;
U.S. patent application Ser. No. 12/650,176 filed on Dec. 30, 2009;
U.S. patent application Ser. No. 12/650,246 filed on Dec. 30, 2009;
U.S. patent application Ser. No. 12/650,292 filed on Dec. 30, 2009;
U.S. patent application Ser. No. 12/650,324 filed on Dec. 30, 2009;
U.S. patent application Ser. No. 12/708,366 filed on Feb. 18, 2010;
U.S. patent application Ser. No. 12/751,751 filed on even date herewith;
U.S. patent application Ser. No. 12/751,550 filed on even date herewith;
U.S. patent application Ser. No. 12/751,768 filed on even date herewith;
U.S. patent application Ser. No. 12/751,759 filed on even date herewith;
U.S. patent application Ser. No. 12/751,593 filed on even date herewith;
U.S. patent application Ser. No. 12/751,772 filed on even date herewith;
U.S. patent application Ser. No. 12/751,777 filed on even date herewith; and
U.S. patent application Ser. No. 12/751,792 filed on even date herewith.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for a distributed leaky wave antenna.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a distributed leaky wave antenna as shown in and/or described in connection with at least one of the figures, as set forth more completely in the claims.

Various advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 4A is a block diagram illustrating an exemplary phase dependence of a single cavity leaky wave antenna, in accordance with an embodiment of the invention.

FIG. 4B is a block diagram illustrating an exemplary distributed leaky wave antenna, in accordance with an embodiment of the invention.

DETAILED DESCRIPTION OF THE INVENTION

Certain aspects of the invention may be found in a method and system for a distributed leaky wave antenna. Exemplary aspects of the invention may comprise communicating RF signals at one or more frequencies via one or more distributed leaky wave antennas in a wireless communication device. The one or more distributed leaky wave antennas may be integrated in one or more multi-layer support structures in the wireless device. The RF signals may be communicated at the one or more frequencies via a plurality of cavity heights in the one or more distributed leaky wave antennas or via a plurality of sections of the one or more distributed leaky wave antennas with different partially reflective surfaces. The one or more multi-layer support structures may comprise an integrated circuit, an integrated circuit package, and/or a printed circuit board. The one or more distributed leaky wave antennas may be configured to transmit the RF signals at a desired angle from a surface of the one or more multi-layer support structures. The one or more distributed leaky wave antennas may comprise microstrip waveguides where the plurality of cavity heights of the one or more distributed leaky wave antennas may be configured based on distances between conductive lines in the microstrip waveguides. The one or more distributed leaky wave antennas may comprise coplanar waveguides where the plurality of cavity heights of the one or more distributed leaky wave antennas may be configured based on distances between conductive lines in the coplanar waveguides. A beam shape of the communicated RF signals may be configured by tuning a frequency of a signal communicated to the one or more distributed leaky wave antennas.

Figure 1:
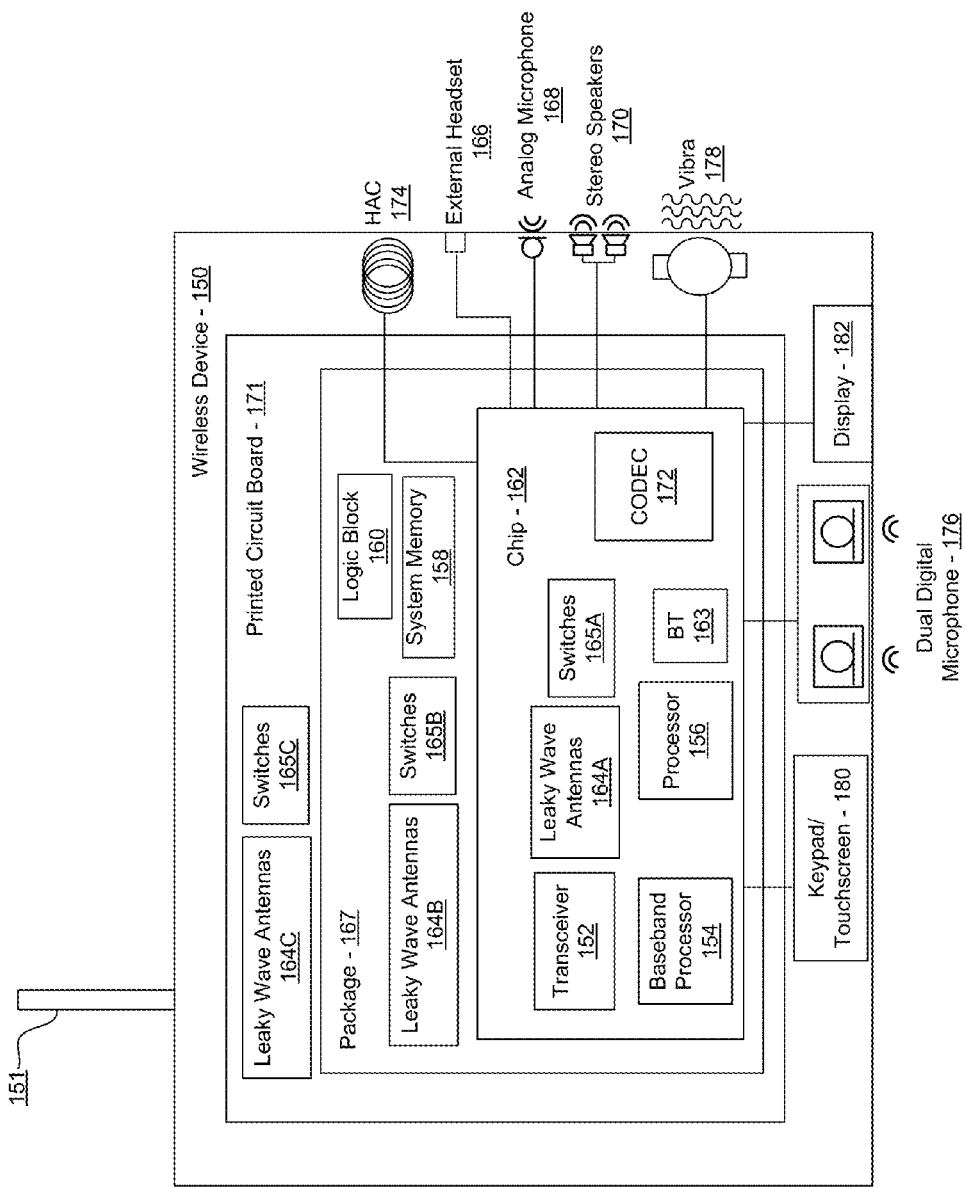
FIG. 1 is a block diagram of an exemplary wireless system with distributed leaky wave antennas, which may be utilized in accordance with an embodiment of the invention.

FIG. 1 is a block diagram of an exemplary wireless system with distributed leaky wave antennas, which may be utilized in accordance with an embodiment of the invention. Referring to FIG. 1, the wireless device 150 may comprise an antenna 151, a transceiver 152, a baseband processor 154, a processor 156, a system memory 158, a logic block 160, a chip 162, leaky wave antennas 164A-164C, switches 165A-165C, an external headset port 166, and a package 167. The wireless device 150 may also comprise an analog microphone 168, integrated hands-free (IHF) stereo speakers 170, a printed circuit board 171, a hearing aid compatible (HAC) coil 174, a dual digital microphone 176, a vibration transducer 178, a keypad and/or touchscreen 180, and a display 182.

The transceiver 152 may comprise suitable logic, circuitry, interface(s), and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151, or the leaky wave antennas 164A-164C. Different wireless systems may use different antennas for transmission and reception. The transceiver 152 may be enabled to execute other functions, for example, filtering the baseband and/or RF signals, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality of transceivers, transmitters and/or receivers. In this regard, the plurality of transceivers, transmitters and/or receivers may enable the wireless device 150 to handle a plurality of wireless protocols and/or standards including cellular, WLAN and PAN. Wireless technologies handled by the wireless device 150 may comprise GSM, CDMA, CDMA2000, WCDMA, GMS, GPRS, EDGE, WIMAX, WLAN, 3GPP, UMTS, BLUETOOTH, and ZigBee, for example.

The baseband processor 154 may comprise suitable logic, circuitry, interface(s), and/or code that may be enabled to process baseband signals for transmission via the transceiver 152 and/or the baseband signals received from the transceiver 152. The processor 156 may be any suitable processor or controller such as a CPU, DSP, ARM, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

Control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The system memory 158 may comprise suitable logic, circuitry, interface(s), and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, interface(s), and/or code that may enable controlling of various functionalities of the wireless device 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

The BT radio/processor 163 may comprise suitable circuitry, logic, interface(s), and/or code that may enable transmission and reception of Bluetooth signals. The BT radio/processor 163 may enable processing and/or handling of BT baseband signals. In this regard, the BT radio/processor 163 may process or handle BT signals received and/or BT signals transmitted via a wireless communication medium. The BT radio/processor 163 may also provide control and/or feedback information to/from the baseband processor 154 and/or the processor 156, based on information from the processed BT signals. The BT radio/processor 163 may communicate information and/or data from the processed BT signals to the processor 156 and/or to the system memory 158. Moreover, the BT radio/processor 163 may receive information from the processor 156 and/or the system memory 158, which may be processed and transmitted via the wireless communication medium a Bluetooth headset, for example The CODEC 172 may comprise suitable circuitry, logic, interface(s), and/or code that may process audio signals received from and/or communicated to input/output devices. The input devices may be within or communicatively coupled to the wireless device 150, and may comprise the analog microphone 168, the stereo speakers 170, the hearing aid compatible (HAC) coil 174, the dual digital microphone 176, and the vibration transducer 178, for example. The CODEC 172 may be operable to up-convert and/or down-convert signal frequencies to desired frequencies for processing and/or transmission via an output device. The CODEC 172 may enable utilizing a plurality of digital audio inputs, such as 16 or 18-bit inputs, for example. The CODEC 172 may also enable utilizing a plurality of data sampling rate inputs. For example, the CODEC 172 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The CODEC 172 may also support mixing of a plurality of audio sources. For example, the CODEC 172 may support audio sources such as general audio, polyphonic ringer, $I^2S$ FM audio, vibration driving signals, and voice. In this regard, the general audio and polyphonic ringer sources may support the plurality of sampling rates that the audio CODEC 172 is enabled to accept, while the voice source may support a portion of the plurality of sampling rates, such as 8 kHz and 16 kHz, for example.

The chip 162 may comprise an integrated circuit with multiple functional blocks integrated within, such as the transceiver 152, the processor 156, the baseband processor 154, the BT radio/processor 163, and the CODEC 172. The number of functional blocks integrated in the chip 162 is not limited to the number shown in FIG. 1. Accordingly, any number of blocks may be integrated on the chip 162 depending on chip space and wireless device 150 requirements, for example. The chip 162 may be flip-chip bonded, for example, to the package 167, as described further with respect to FIG. 8.

The leaky wave antennas 164A-164C may comprise one or more resonant cavities with a highly reflective surface and a lower reflectivity surface, and may be integrated in and/or on the chip 162, the package 167, and/or the printed circuit board 171. The lower reflectivity surface, or frequency selective surface, may allow the resonant mode to "leak" out of the cavity. The lower reflectivity surface of the leaky wave antennas 164A-164C may be configured with slots in a metal surface, or a pattern of metal patches, as described further in FIGS. 2 and 3. The physical dimensions of the leaky wave antennas 164A-164C may be configured to optimize bandwidth of transmission and/or the beam pattern radiated. By integrating the leaky wave antennas 164A on the chip 162, wireless signals may be communicated between various regions of the chip 162 as well as to devices external to the chip 162.

In an exemplary embodiment of the invention, the leaky wave antennas 164A-164C may comprise a plurality of distributed leaky wave antennas integrated in and/or on the chip 162, the package 167, and/or printed circuit board 171. The leaky wave antennas 164A-164C may be operable to transmit and/or receive wireless signals at or near 60 GHz, for example, due to the cavity length of the devices being on the order of millimeters. The distributed leaky wave antennas 164A-164C may comprise sections with different cavity heights and feed points. A different feed signal may be communicated to each feed point, thereby enabling the transmission of signals at different frequencies concurrently, in the same approximate location.

In another embodiment of the invention, the distributed leaky wave antennas 164A-164C may comprise a single cavity height, but with a different partially reflective surface in different regions. In this manner, different harmonics of the feed signal may leak out of the different regions with different frequency selective surfaces.

Figure 3:
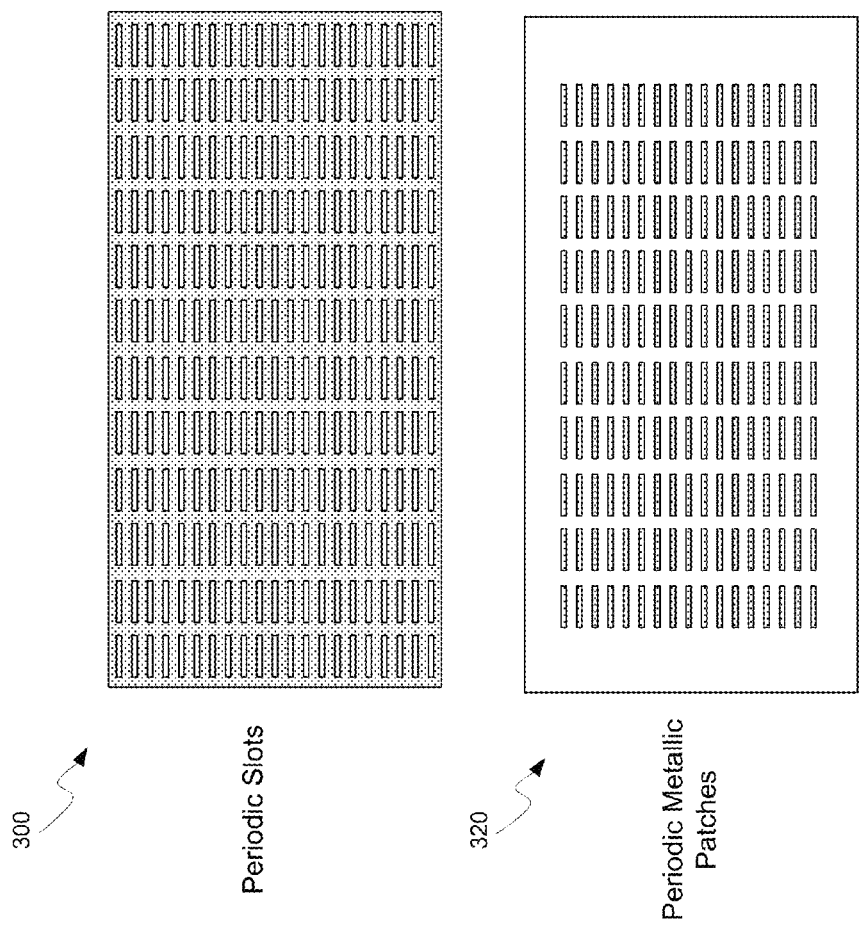
FIG. 3 is a block diagram illustrating a plan view of exemplary partially reflective surfaces for a leaky wave antenna, in accordance with an embodiment of the invention.

The switches 165A-165C may comprise switches such as CMOS or MEMS switches that may be operable to switch different antennas of the leaky wave antennas 164A-164C to the transceiver 152 and/or switch elements in and/or out of the leaky wave antennas 164A-164C, such as the patches and slots described in FIG. 3.

The external headset port 166 may comprise a physical connection for an external headset to be communicatively coupled to the wireless device 150. The analog microphone 168 may comprise suitable circuitry, logic, interface(s), and/or code that may detect sound waves and convert them to electrical signals via a piezoelectric effect, for example. The electrical signals generated by the analog microphone 168 may comprise analog signals that may require analog to digital conversion before processing.

The package 167 may comprise a ceramic package, a printed circuit board, or other support structure for the chip 162 and other components of the wireless device 150. In this regard, the chip 162 may be bonded to the package 167. The package 167 may comprise insulating and conductive material, for example, and may provide isolation between electrical components mounted on the package 167.

The stereo speakers 170 may comprise a pair of speakers that may be operable to generate audio signals from electrical signals received from the CODEC 172. The HAC coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The dual digital microphone 176 may comprise suitable circuitry, logic, interface(s), and/or code that may be operable to detect sound waves and convert them to electrical signals. The electrical signals generated by the dual digital microphone 176 may comprise digital signals, and thus may not require analog to digital conversion prior to digital processing in the CODEC 172. The dual digital microphone 176 may enable beamforming capabilities, for example.

The vibration transducer 178 may comprise suitable circuitry, logic, interface(s), and/or code that may enable notification of an incoming call, alerts and/or message to the wireless device 150 without the use of sound. The vibration transducer may generate vibrations that may be in synch with, for example, audio signals such as speech or music.

In operation, control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The CODEC 172 in the wireless device 150 may communicate with the processor 156 in order to transfer audio data and control signals. Control registers for the CODEC 172 may reside within the processor 156. The processor 156 may exchange audio signals and control information via the system memory 158. The CODEC 172 may up-convert and/or down-convert the frequencies of multiple audio sources for processing at a desired sampling rate.

The leaky wave antennas 164A-164C may be operable to transmit and/or receive wireless signals between the chip 162, the package 167, and/or the printed circuit board 171 to other devices in the wireless device and/or to devices external to the wireless device 150. Resonant cavities may be configured between reflective surfaces in and/or on the chip 162, the package 167, and/or the printed circuit board 171 so that signals may be transmitted and/or received from any location on the chip 162, the package 167, and/or the printed circuit board 171 without requiring large areas needed for conventional antennas and associated circuitry. Coplanar waveguide structures may be utilized to enable the communication of signals in the horizontal direction within the chip 162, the package 167, and/or the printed circuit board 171.

The frequency of the transmission and/or reception may be determined by the cavity height of the leaky wave antennas 164A-164C and/or the frequency selective surface of the cavity. For example, different sections of the leaky wave antennas 164A-164C may comprise different cavity heights, thereby enabling the transmission and/or reception of signals of different frequency.

In another embodiment of the invention, the spacing and orientation of the slots or patches, described with respect to FIG. 3, of a region of the leaky wave antennas 164A-164C may be tuned to a frequency of a feed signal, whereas other regions of the leaky wave antennas 164A-164C may comprise a frequency selective surface that may be tuned to harmonics of the feed signal frequency, thereby configuring a distributed antenna.

Similarly, the beam shape of the transmitted signal may be a function of the frequency of the feed signal as compared to the resonant frequency of the cavity. By feeding a signal to the sections of the distributed leaky wave antenna, a beam shape may result with increased signal in a desired direction from the leaky wave antennas, as compared to a single resonant cavity leaky wave antenna.

Figure 2:
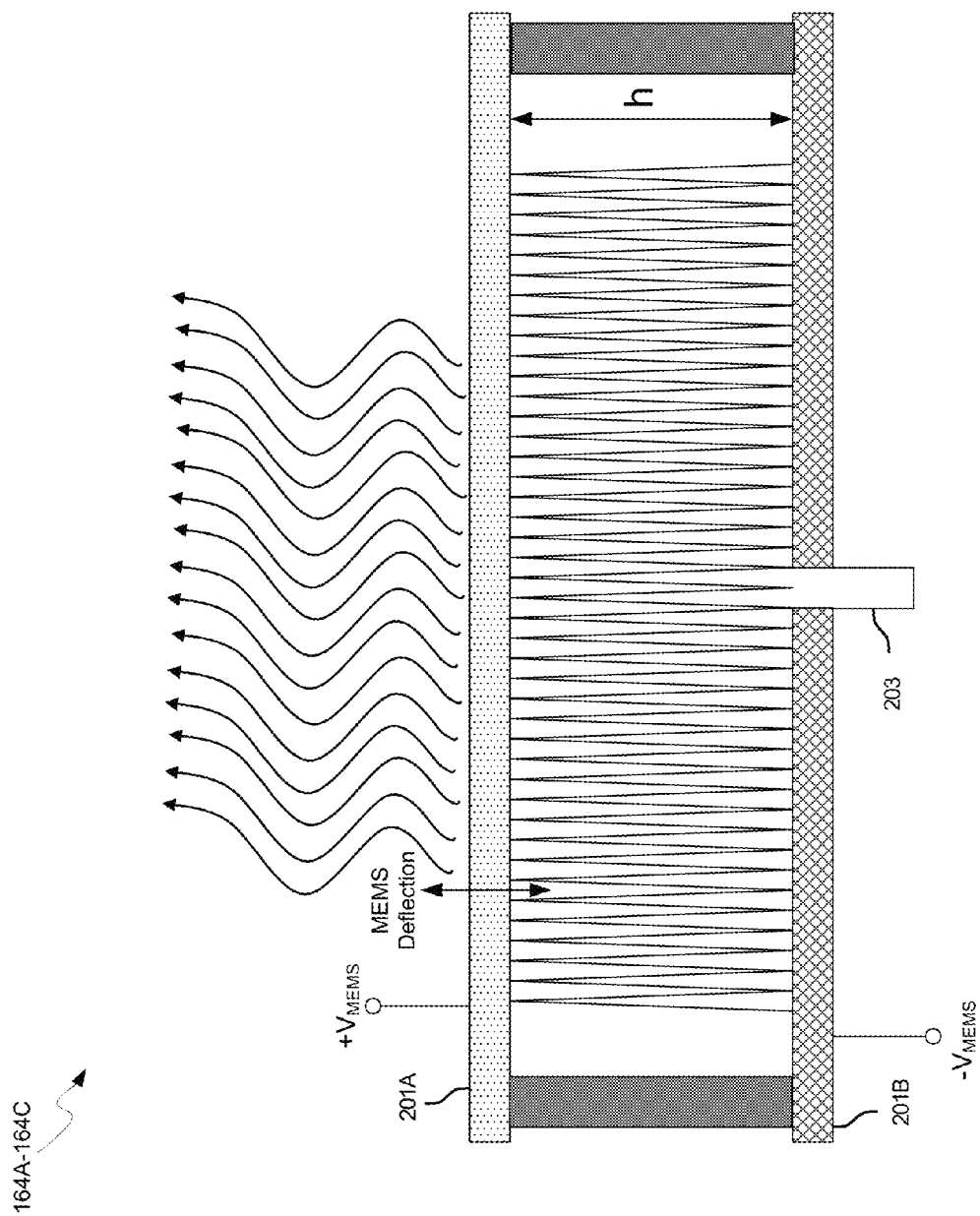
FIG. 2 is a block diagram illustrating an exemplary single cavity leaky wave antenna, in accordance with an embodiment of the invention.

FIG. 2 is a block diagram illustrating an exemplary single cavity leaky wave antenna, in accordance with an embodiment of the invention. Referring to FIG. 2, there is shown the leaky wave antennas 164A-164C comprising a partially reflective surface 201A, a reflective surface 201B, and a feed point 203. The space between the partially reflective surface 201A and the reflective surface 201B may be filled with dielectric material, air or a combination of dielectric material for a gap, for example, and the height, h, between the partially reflective surface 201A and the reflective surface 201B may be utilized to configure the frequency of transmission of the leaky wave antennas 164A-164C. In another embodiment of the invention, a gap may be integrated in the space between the partially reflective surface 201A and the reflective surface 201B to enable MEMS actuation. Accordingly, there is also shown (micro-electromechanical systems) MEMS bias voltages, $+V_{MEMS}$ and $-V_{MEMS}$.

The feed point 203 may comprise an input terminal for applying an input voltage to the leaky wave antennas 164A-164C. The invention is not limited to a single feed point 203, as there may be any amount of feed points for different phases of signal or a plurality of signal sources, for example, to be applied to the leaky wave antennas 164A-164C. Accordingly, for leaky wave antennas comprising sections of different cavity height and thus resonant frequency, different feed points may be utilized to supply signals to be transmitted at different frequency from the same leaky wave antenna.

In an embodiment of the invention, the height, h, may be one-half the wavelength of the desired transmitted mode from the leaky wave antennas 164A-164C. In this manner, the phase of an electromagnetic mode that traverses the cavity twice may be coherent with the input signal at the feed point 203, thereby configuring a resonant cavity known as a Fabry-Perot cavity. The magnitude of the resonant mode may decay exponentially in the lateral direction from the feed point 203, thereby reducing or eliminating the need for confinement structures to the sides of the leaky wave antennas 164A-164C. In addition, different sections of the leaky wave antennas 164A-164C with different cavity heights may be adjacent to sections separated by an appropriate distance for the resonant mode to decay exponential in the lateral direction to avoid crosstalk. The input impedance of the leaky wave antennas 164A-164C may be configured by the vertical placement of the feed point 203, as described further in FIG. 6.

In operation, one or more signals to be transmitted via a power amplifier in the transceiver 152 may be communicated to the feed point 203, or multiple feed points, of the leaky wave antennas 164A-164C with a frequency f. The cavity height, h, may be configured to correlate to one half the wavelength of a harmonic of the signal of frequency f. The signal may traverse the height of the cavity and may be reflected by the partially reflective surface 201A, and then traverse the height back to the reflective surface 201B. Since the wave will have traveled a distance corresponding to a full wavelength, constructive interference may result and a resonant mode may thereby be established.

In an embodiment of the invention, the leaky wave antennas 164A-164C may comprise a plurality of sections with different cavity heights, thereby enabling the transmission and/or reception of signals at different frequencies from the same leaky wave antenna, thus a distributed leaky wave antenna. Accordingly, a feed point in each section of the distributed leaky wave antenna may received a signal at a different frequency that corresponds to the resonant frequency of that section of the distributed leaky wave antenna.

In another embodiment of the invention, the partially reflective surface 201A may comprise sections of different spacing and/or orientation of slots and/or patches, resulting in a different frequency of leaked signal, such as a harmonic frequency of the resonant frequency of the cavity. In this manner, different frequency signals may be communicated from the leaky wave antenna from a single source signal to different feed points.

Leaky wave antennas may enable the configuration of high gain antennas without the need for a large array of antennas which require a complex feed network and suffer from loss due to feed lines. The leaky wave antennas 164A-164C may be operable to transmit and/or receive wireless signals via conductive layers in and/or on chip 162, the package 167, and the printed circuit board 171. In this manner, the resonant frequency of the cavity may cover a wider range due to the larger size of the package 167, compared to the chip 162, without requiring large areas needed for conventional antennas and associated circuitry.

In another embodiment of the invention, the cavity height, h, of each section may be configured by MEMS actuation. For example, the bias voltages $+V_{MEMS}$ and $-V_{MEMS}$ may deflect one or both of the reflective surfaces 201A and 201B compared to zero bias, thereby configuring the resonant frequency and thus a direction of transmission of the cavity for the same input signal.

FIG. 3 is a block diagram illustrating a plan view of exemplary partially reflective surfaces for a leaky wave antenna, in accordance with an embodiment of the invention. Referring to FIG. 3, there is shown a partially reflective surface 300 comprising periodic slots in a metal surface, and a partially reflective surface 320 comprising periodic metal patches. The partially reflective surfaces 300/320, or frequency selective surfaces, may comprise different embodiments of the partially reflective surface 201A described with respect to FIG. 2.

The spacing, dimensions, shape, and orientation of the slots and/or patches in the partially reflective surfaces 300/320 may be utilized to configure the bandwidth, and thus Q-factor, of the resonant cavity defined by the partially reflective surfaces 300/320 and a reflective surface, such as the reflective surface 201B, described with respect to FIG. 2. The partially reflective surfaces 300/320 may thus comprise frequency selective surfaces due to the narrow bandwidth of signals that may leak out of the structure as configured by the slots and/or patches.

The spacing between the patches and/or slots may be related to wavelength of the signal transmitted and/or received, which may be somewhat similar to beamforming with multiple antennas. The length of the slots and/or patches may be several times larger than the wavelength of the transmitted and/or received signal or less, for example, since the leakage from the slots and/or regions surround the patches may add up, similar to beamforming with multiple antennas.

In an embodiment of the invention, the slots/patches may be configured via CMOS and/or micro-electromechanical system (MEMS) switches, such as the switches 165A-165C described with respect to FIG. 1, to tune the Q and/or the frequency of the signal leaked from the resonant cavity. The slots and/or patches may be configured in conductive layers in and/or on the chip 162, the package 167, and/or the printed circuit board 171 and may be shorted together or switched open utilizing the switches 165A-165C. In this manner, RF signals, such as 60 GHz signals, for example, may be transmitted from various locations in the chip 162, the package 167, and/or the printed circuit board 171 without the need for additional circuitry and conventional antennas with their associated circuitry that require valuable chip space.

In an embodiment of the invention, the leaky wave antennas comprising the partially reflective surfaces 300/320 may comprise sections with different cavity heights enabling the transmission and/or reception of signals with different frequency from the same leaky wave antenna.

In another embodiment of the invention, the slots or patches in the partially reflective surfaces 300/320 may be configured with different frequency selectivity in different regions of the leaky wave antenna, such shat each region may leak a different frequency signal.

FIG. 4A is a block diagram illustrating an exemplary phase dependence of a single cavity leaky wave antenna, in accordance with an embodiment of the invention. Referring to FIG. 4A, there is shown a leaky wave antenna comprising the partially reflective surface 201A, the reflective surface 201B, and the feed point 203. In-phase condition 400 illustrates the relative beam shape transmitted by the leaky wave antennas 164A-164C when the frequency of the signal communicated to the feed point 203 matches that of the resonant cavity as defined by the cavity height, h, and the dielectric constant of the material between the reflective surfaces.

Similarly, out-of-phase condition 420 illustrates the relative beam shape transmitted by the leaky wave antenna 164A-164C when the frequency of the signal communicated to the feed point 203 does not match that of the resonant cavity. The resulting beam shape may be conical, as opposed to a single main vertical node. These are illustrated further with respect to FIG. 5. The leaky wave antennas 164A-164C may be integrated at various heights in the chip 162, the package 167, and the printed circuit board 171, thereby providing a plurality of transmission and reception sites in the chip 162 with varying resonant frequency. In addition, a coplanar structure may be utilized to configure leaky wave antennas in the chip 162, the package 167, and/or the printed circuit board 171, thereby enabling communication of wireless signals in the horizontal plane of the chip 162, the package 167, and/or the printed circuit board 171.

By configuring the leaky wave antennas 164A-164C for in-phase and out-of-phase conditions, signals possessing different characteristics may be directed out of the chip 162, the package 167, and/or printed circuit board 171 in desired directions. In an exemplary embodiment of the invention, the angle at which signals may be transmitted by a leaky wave antenna may be dynamically controlled so that signal may be directed to desired receiving leaky wave antennas. In another embodiment of the invention, the leaky wave antennas 164 may be operable to receive RF signals, such as 60 GHz signals, for example. The direction in which the signals are received may be configured by the in-phase and out-of-phase conditions.

In an embodiment of the invention, a distributed leaky wave antenna comprising a plurality of cavity heights may be configured such that adjacent sections may transmit different frequency signals. Accordingly, different feed signals may be communicated to the different sections of the distributed leaky wave antenna, thereby enabling transmission of signals at a plurality of frequencies from a single leaky wave antenna.

In another embodiment of the invention, the slots or patches in the partially reflective surface 201 may comprise sections with different slot and/or patch periodicity and/or orientation thereby allowing different frequency signals to leak out in different regions of the leaky wave antenna. In this manner, a single feed signal may be utilized to generate a plurality of transmitted signals at different frequencies.

FIG. 4B is a block diagram illustrating an exemplary distributed leaky wave antenna, in accordance with an embodiment of the invention. Referring to FIG. 4B, there is shown a distributed leaky wave antenna 440 comprising a plurality of cavity heights, $h_1$, $h_2$, and $h_3$ configured by the reflective surface 201B and the partially reflective surface 201A, and feed points 403A-403C. There is also shown feed signals 401A-401B.

By utilizing a plurality of cavity heights in a distributed leaky wave antenna, the transmitted, or received, signals may comprise a plurality of frequencies. For example, by utilizing the three sections with cavity heights of $h_1$, $h_2$, and $h_3$, three signals of different frequency may be transmitted where $f_{h1} > f_{h2} > f_{h3}$. Similarly, the three sections with different resonant frequency may be operable to receive signals of different frequency.

The distributed leaky wave antenna 440 is not limited to the number of cavity heights shown or to the exemplary configuration shown. Accordingly, any number of cavity heights and arrangements may be utilized to result in a desired number of different frequency signals transmitted by the distributed leaky wave antenna 440.

Figure 4C:
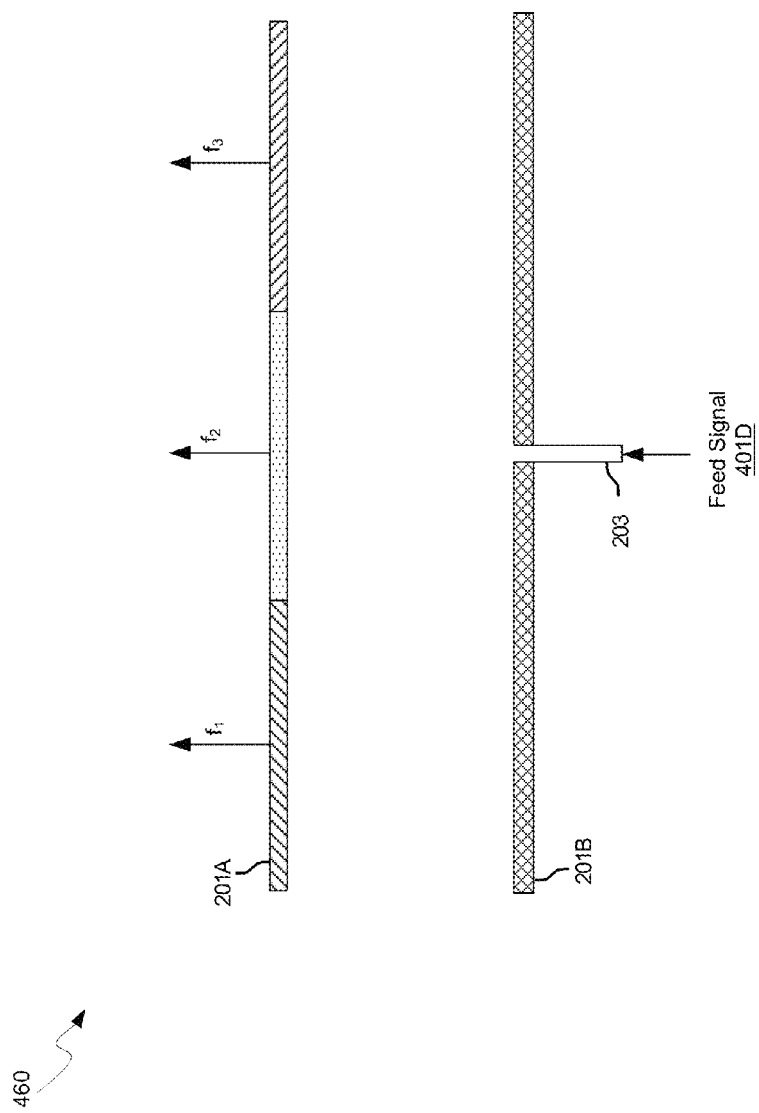
FIG. 4C is a block diagram illustrating an exemplary distributed leaky wave antenna, in accordance with an embodiment of the invention.

FIG. 4C is a block diagram illustrating an exemplary distributed leaky wave antenna, in accordance with an embodiment of the invention. Referring to FIG. 4B, there is shown a distributed leaky wave antenna 460 comprising the partially reflective surface 201A, the reflective surface 201B, and feed point 203. There is also shown a feed signal 401D. The partially reflective surface 201A may comprise a plurality of sections with different configurations of slots and/or patches thereby configuring each section to leak signals of a different frequency. The different regions may be spaced closely enough that the exponential decay of the resonant mode may not reduce the signal strength appreciably so that the signal may be strong enough in adjacent sections to enable a plurality of transmitted signals.

By utilizing a plurality of sections in the partially reflective surface 201A in the distributed leaky wave antennas 460, the transmitted and/or received signals may comprise a plurality of frequencies. For example, by utilizing the three sections with different patch and/or slot spacing and/or size, three signals of different frequency may be transmitted. Similarly, each of the three sections with a different resonant frequency may be operable to receive signals of different frequency. In an embodiment of the invention, the different frequencies may be harmonics of the frequency of the feed signal 401D.

The distributed leaky wave antenna 460 is not limited to the number of sections in the partially reflective surface 201A shown or to the exemplary configuration shown. Accordingly, any number of sections and arrangements may be utilized to result in a desired number of different frequency signals transmitted by the distributed leaky wave antenna 460.

Figure 5:
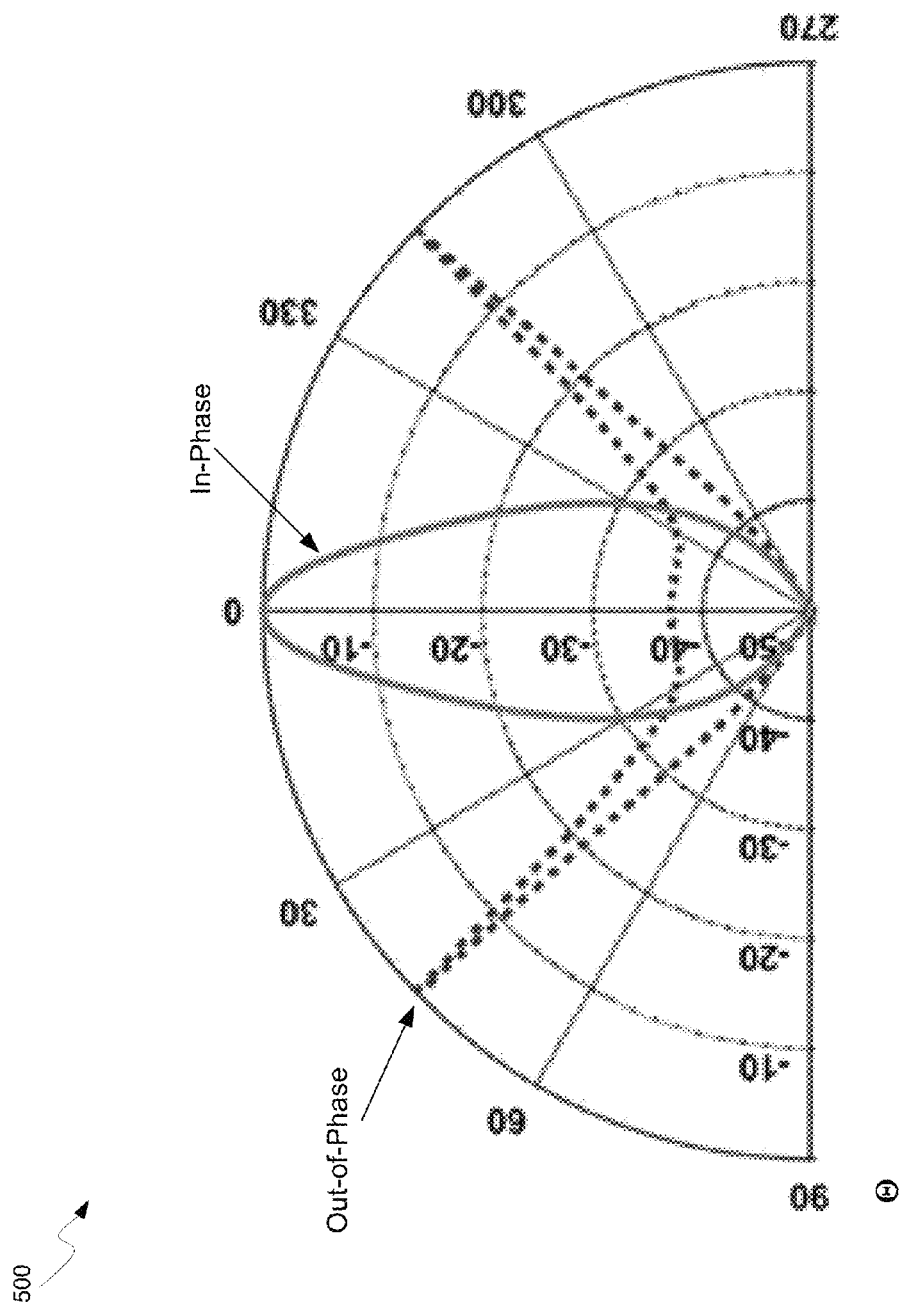
FIG. 5 is a block diagram illustrating exemplary in-phase and out-of-phase beam shapes for a leaky wave antenna, in accordance with an embodiment of the invention.

FIG. 5 is a block diagram illustrating exemplary in-phase and out-of-phase beam shapes for a leaky wave antenna, in accordance with an embodiment of the invention. Referring to FIG. 5, there is shown a plot 500 of transmitted signal beam shape versus angle, Θ, for the in-phase and out-of-phase conditions for a leaky wave antenna.

The In-phase curve in the plot 500 may correlate to the case where the frequency of the signal communicated to a leaky wave antenna matches the resonant frequency of the cavity. In this manner, a single vertical main node may result. In instances where the frequency of the signal at the feed point is not at the resonant frequency, a double, or conical-shaped node may be generated as shown by the Out-of-phase curve in the plot 500. By configuring the leaky wave antennas for in-phase and out-of-phase conditions, signals may be directed out of the chip 162, the package 167, and/or the printed circuit board 171 in desired directions.

In an embodiment of the invention, the leaky wave antennas 164A-164C may be operable to transmit and/or receive wireless signals, and may be configured to transmit or receive to/from a desired direction via the in-phase and out-of-phase configurations. For example, by utilizing a distributed leaky wave antenna with a plurality of cavity heights, and thus a corresponding plurality of resonant frequencies, a plurality of frequencies may result from a single feed source, where the direction of transmission may be tuned by tuning the frequency of the feed signal. Similarly, when receiving a single frequency signal, a plurality of resonant frequencies may be communicated from the antenna to associated receiver circuitry due to the different sections of the distributed leaky wave antenna, and may be received from different angles depending on the difference between the frequency of the received signal from the resonant frequency, or harmonic, of the distributed leaky wave antenna sections.

Figure 6:
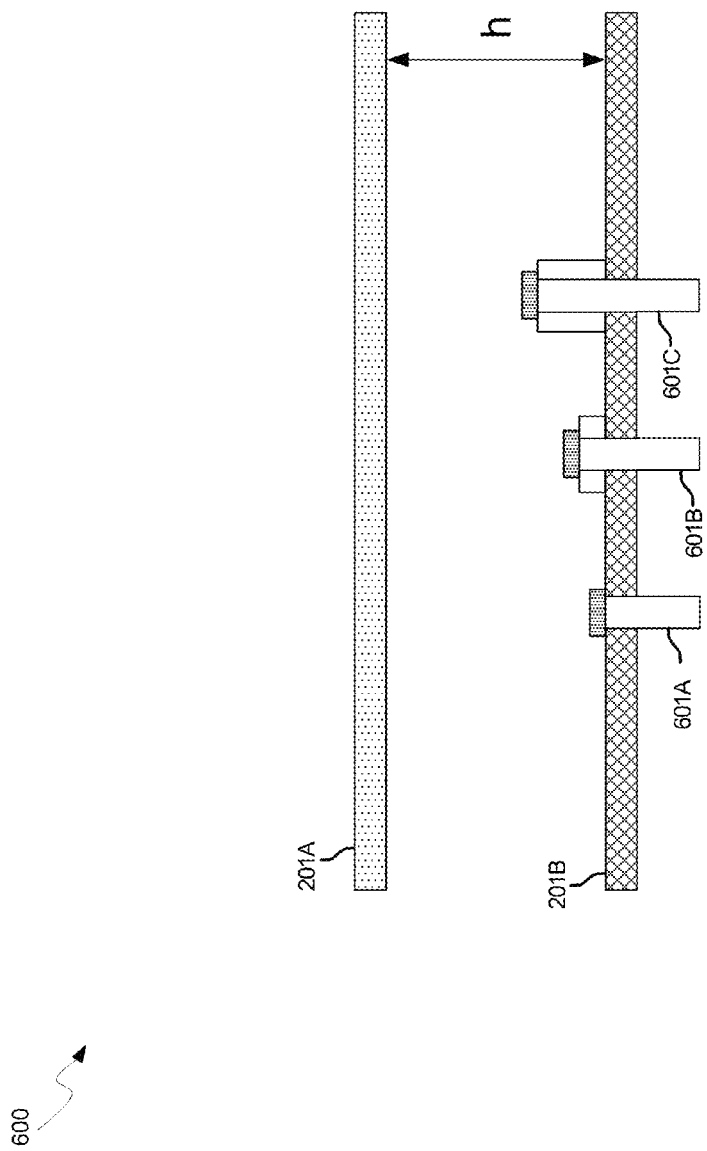
FIG. 6 is a block diagram illustrating a leaky wave antenna with variable input impedance feed points, in accordance with an embodiment of the invention.

FIG. 6 is a block diagram illustrating a leaky wave antenna with variable input impedance feed points, in accordance with an embodiment of the invention. Referring to FIG. 6, there is shown a leaky wave antenna 600 comprising the partially reflective surface 201A and the reflective surface 201B. There is also shown feed points 601A-601C. The feed points 601A-601C may be located at different positions along the height, h, of the cavity thereby configuring different impedance points for the leaky wave antenna.

In this manner, a leaky wave antenna may be utilized to couple to a plurality of power amplifiers, low-noise amplifiers, and/or other circuitry with varying output or input impedances. Similarly, by integrating leaky wave antennas in conductive layers in the chip 162, the impedance of the leaky wave antenna may be matched to the power amplifier or low-noise amplifier without impedance variations that may result with conventional antennas and their proximity or distance to associated driver electronics. Similarly, by integrating reflective and partially reflective surfaces with varying cavity heights and varying feed points, leaky wave antennas with different impedances and resonant frequencies may be enabled.

Figure 7:
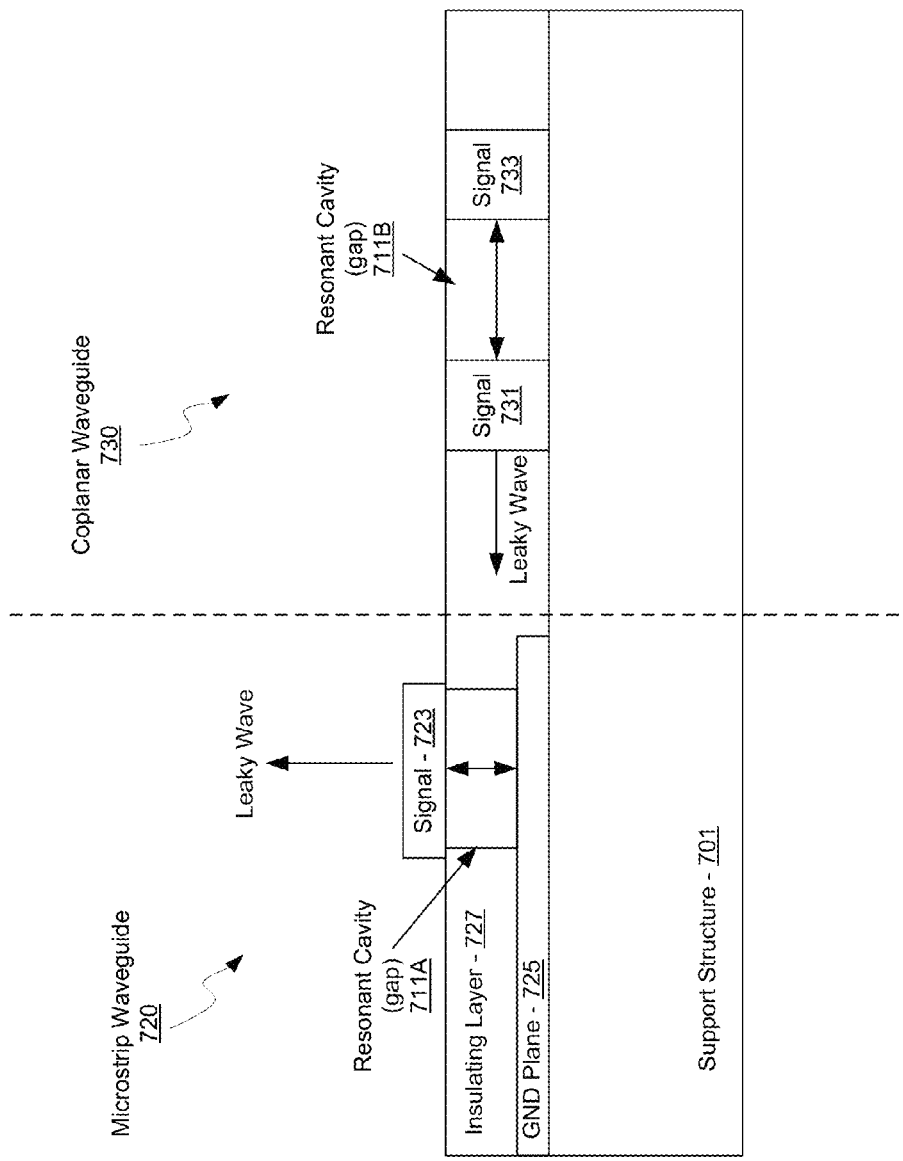
FIG. 7 is a block diagram illustrating a cross-sectional view of coplanar and microstrip waveguides, in accordance with an embodiment of the invention.

FIG. 7 is a block diagram illustrating a cross-sectional view of coplanar and microstrip waveguides, in accordance with an embodiment of the invention. Referring to FIG. 7, there is shown a microstrip waveguide 720 and a coplanar waveguide 730 and a support structure 701. The microstrip waveguide 720 may comprise signal conductive lines 723, a ground plane 725, a resonant cavity 711A, and an insulating layer 727. The coplanar waveguide 730 may comprise signal conductive lines 731 and 733, a resonant cavity 711B, the insulating layer 727, and a multi-layer support structure 701. The support structure 701 may comprise the chip 162, the package 167, and/or the printed circuit board 171.

The signal conductive lines 723, 731, and 733 may comprise metal traces or layers deposited in and/or on the insulating layer 727. In another embodiment of the invention, the signal conductive lines 723, 731, and 733 may comprise poly-silicon or other conductive material. The separation and the voltage potential between the signal conductive line 723 and the ground plane 725 may determine the electric field generated therein. In addition, the dielectric constant of the insulating layer 727 may also determine the electric field between the signal conductive line 723 and the ground plane 725.

The resonant cavities 711A and 711B may comprise the insulating layer 727, an air gap, or a combination of an air gap and the insulating layer 727, thereby enabling MEMS actuation and thus frequency tuning.

The insulating layer 727 may comprise $SiO_2$ or other insulating material that may provide a high resistance layer between the signal conductive line 723 and the ground plane 725, and the signal conductive lines 731 and 733. In addition, the electric field between the signal conductive line 723 and the ground plane 725 may be dependent on the dielectric constant of the insulating layer 727.

The thickness and the dielectric constant of the insulating layer 727 may determine the electric field strength generated by the applied signal. The resonant cavity thickness of a leaky wave antenna may be dependent on the spacing between the signal conductive line 723 and the ground plane 725, or the signal conductive lines 731 and 733, for example.

The signal conductive lines 731 and 733, and the signal conductive line 723 and the ground plane 725 may define resonant cavities for leaky wave antennas. Each layer may comprise a reflective surface or a partially reflective surface depending on the pattern of conductive material. For example, a partially reflective surface may be configured by alternating conductive and insulating material in a desired pattern. In this manner, signals may be directed out of, or received into, a surface of the chip 162, the package 167, and/or the printed circuit board 171, as illustrated with the microstrip waveguide 720. In another embodiment of the invention, signals may be communicated in the horizontal plane of the chip 162, the package 167, and/or the printed circuit board 171 utilizing the coplanar waveguide 730.

The support structure 701 may provide mechanical support for the microstrip waveguide 720, the coplanar waveguide 730, and other devices that may be integrated within. In another embodiment of the invention, the chip 162, the package 167, and/or the printed circuit board 171 may comprise Si, GaAs, sapphire, InP, GaO, ZnO, CdTe, CdZnTe, ceramics, polytetrafluoroethylene, and/or $Al_2O_3$, for example, or any other substrate material that may be suitable for integrating microstrip structures.

In operation, a bias and/or a signal voltage may be applied across the signal conductive line 723 and the ground plane 725, and/or the signal conductive lines 731 and 733. The thickness of a leaky wave antenna resonant cavity may be dependent on the distance between the conductive lines in the microstrip waveguide 720 and/or the coplanar transmission waveguide 730.

By alternating patches of conductive material with insulating material, or slots of conductive material in dielectric material, a partially reflective surface may result, which may allow a signal to "leak out" in that direction, as shown by the Leaky Wave arrows in FIG. 7. In this manner, wireless signals may be directed out of the surface plane of the support structure 710, or parallel to the surface of the support structure 710.

In an embodiment of the invention, a distributed leaky wave antenna may be configured by sequentially integrating a plurality of microstrip waveguides or coplanar waveguides of different cavity heights. Thus, by placing the signal conductive line 723 closer to or farther from the ground plane 725 in different sections of the distributed leaky wave antenna, regions of different resonant frequency may be enabled.

Similarly, by sequentially placing the conductive signal lines 731 and 733 with different spacing, different cavity heights may result, and thus different resonant frequencies, thereby forming a distributed leaky wave antenna. In this manner, a plurality of signals at different frequencies may be transmitted from, or received by, the distributed leaky wave antenna.

Figure 8:
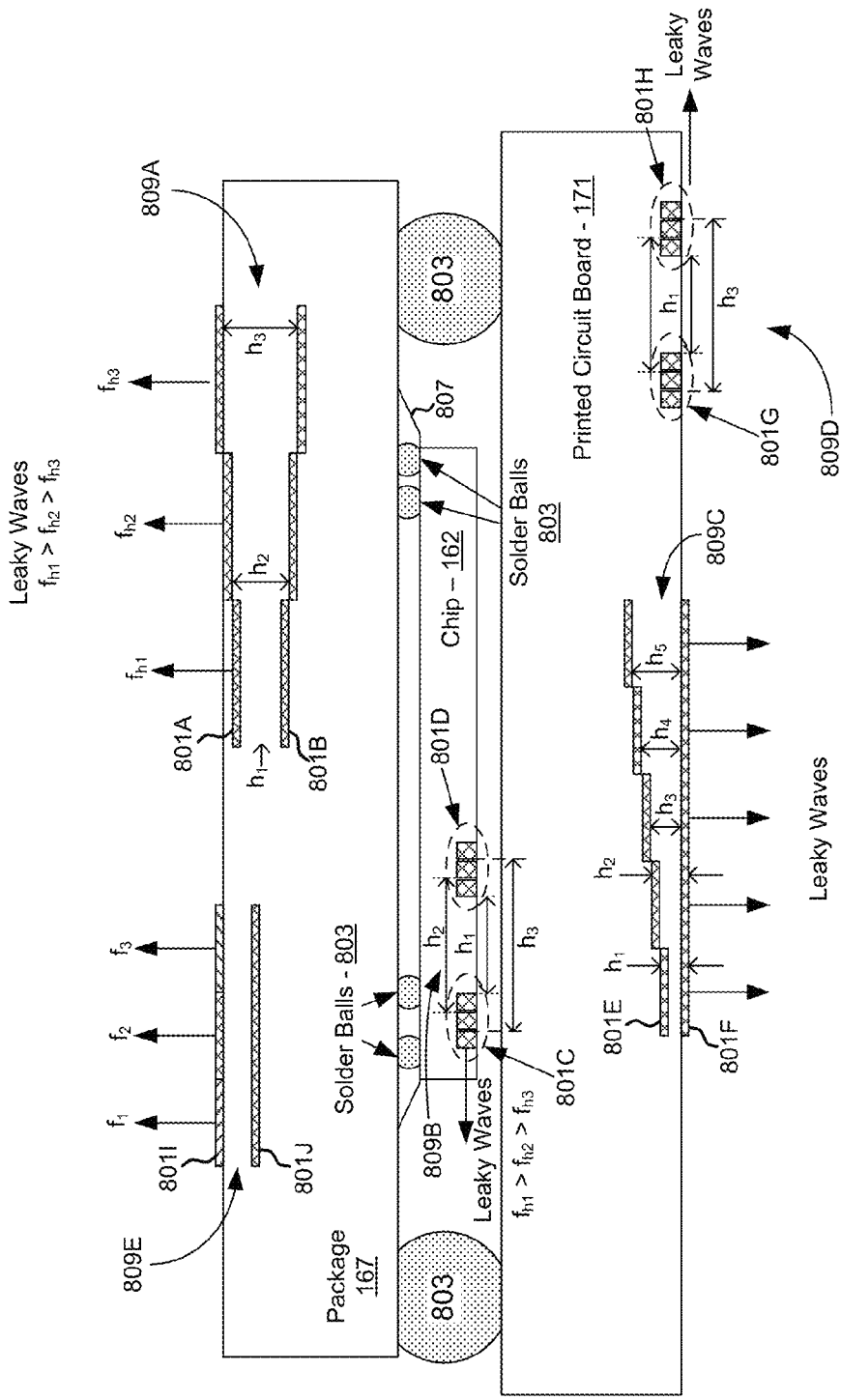
FIG. 8 is a diagram illustrating a cross-sectional view of exemplary distributed leaky wave antennas, in accordance with an embodiment of the invention.

FIG. 8 is a diagram illustrating a cross-sectional view of exemplary distributed leaky wave antennas, in accordance with an embodiment of the invention. Referring to FIG. 8, there is shown metal layers 801A-801J, solder balls 803, thermal epoxy 807, and leaky wave antennas 809A-809E. The chip 162, the package 167, and the printed circuit board 171 may be as described previously.

The chip 162, or integrated circuit, may comprise one or more components and/or systems within the wireless system 150. The chip 162 may be bump-bonded or flip-chip bonded to the package 167 utilizing the solder balls 803. In this manner, wire bonds connecting the chip 162 to the package 167 may be eliminated, thereby reducing and/or eliminating uncontrollable stray inductances due to wire bonds, for example. In addition, the thermal conductance out of the chip 162 may be greatly improved utilizing the solder balls 803 and the thermal epoxy 807. The thermal epoxy 807 may be electrically insulating but thermally conductive to allow for thermal energy to be conducted out of the chip 162 to the much larger thermal mass of the package 167.

The metal layers 801A-801J may comprise deposited metal layers utilized to delineate distributed leaky wave antennas in and/or on the chip 162, the package 167, and the printed circuit board 171. The metal layers 801A-801J may be utilized to communicate signals between the chip 162, the package 167, the printed circuit board 172, and/or to external devices via distributed leaky wave antennas integrated in the chip 162. In addition, the leaky wave antennas 809B and 809D may comprise conductive and insulating layers integrated in and/or on the chip 162, the package 167, and/or the printed circuit board 171 to enable communication of signals horizontally in the plane of the structure, as illustrated by the coplanar waveguide 730 described with respect to FIG. 7.

In an embodiment of the invention, the spacing between pairs of metal layers, for example as illustrated by the heights $h_1$-$h_5$, may define resonant cavities of distributed leaky wave antennas. In this regard, a partially reflective surface, as shown in FIGS. 2 and 3, for example, may enable the resonant electromagnetic mode in the cavity to leak out from that surface. In this manner, distributed leaky wave antennas may be operable to communicate wireless signals to and/or from the chip 162, the package 167 and/or the printed circuit board 171, and/or to external devices.

The spacing between the metal layers may be different in different sections of the leaky wave antenna, such as between the metal layers 801A and 801B defining the microstrip distributed leaky wave antenna 809A with cavity heights $h_1$, $h_2$, and $h_3$ or the metal layers 801E and 801F defining the distributed leaky wave antenna 809C with cavity heights $h_1$-$h_5$.

Similarly, metal layers may be integrated in a coplanar waveguide configuration with different lateral spacing in each section, such as the spacing between the metal layers 801C and 801D and 801G and 801H that may define the coplanar distributed leaky wave antennas 809B and 809D, respectively, thereby enabling communication of wireless signals in the plane of the chip 162, the package 167, and/or the printed circuit board 171. In this manner, different cavity heights may enable the transmission of a plurality of signal at different frequencies from the same antenna.

In another embodiment of the invention, a partially reflective surface of a distributed leaky wave antenna may comprise sections with different frequency selectivity, such as with the distributed leaky wave antenna 809E. The metal layer 801I may be configured with different sections that may be tuned to different frequencies, such as harmonics of a feed signal communicated to the distributed leaky wave antenna 809E.

The region between the metal layers 801A-801J may comprise a resistive material and/or an air gap, or a combination of an air gap and resistive material, which may provide electrical isolation between the metal layers 801A-801J and a gap for MEMS actuation, thereby creating a resonant cavity.

The number of metal layers is not limited to the number of metal layers 801A-801J shown in FIG. 8. Accordingly, there may be any number of layers embedded within and/or on the chip 162, the package 167, and/or the printed circuit board 171, depending on the number of leaky wave antennas, traces, waveguides and other devices fabricated.

The solder balls 803 may comprise spherical balls of metal to provide electrical, thermal and physical contact between the chip 162, the package 167, and/or the printed circuit board 171. In making the contact with the solder balls 803, the chip 162, the package 167, and/or the printed circuit board may be pressed with enough force to squash the metal spheres somewhat, and may be performed at an elevated temperature to provide suitable electrical resistance and physical bond strength. The thermal epoxy 807 may fill the volume between the solder balls 803 and may provide a high thermal conductance path for heat transfer out of the chip 162 and/or the package 167.

In operation, the chip 162 may comprise an RF front end, such as the RF transceiver 152, described with respect to FIG. 1, and may be utilized to transmit and/or receive RF signals, at 60 GHz, for example. The chip 162 may be electrically coupled to the package 167, which may be electrically coupled to the printed circuit board 171. In instances where high frequency signals, 60 GHz or greater, for example, may be communicated between from the chip 162, the package 167, and/or the printed circuit board 172 to other devices in the wireless device 150 or to external devices, leaky wave antennas may be utilized. Accordingly, the distributed leaky wave antennas 809A-809E integrated on or within the chip 162, the package 167, and/or the printed circuit board 171 may be enabled to communicate wireless signals at a plurality of frequencies.

The integration of leaky wave antennas in the chip 162, the package 167, and the printed circuit board 171 may result in the reduction of stray impedances when compared to wire-bonded connections between structures as in conventional systems, particularly for higher frequencies, such as 60 GHz. In this manner, volume requirements may be reduced and performance may be improved due to lower losses and accurate control of impedances via switches in the chip 162 or on the package 167, for example.

In an embodiment of the invention, distributed leaky wave antennas, such as the distributed leaky wave antennas 809A-809D, may be integrated in the chip 162, the package 167, and/or the printed circuit board 172. By communicating different signals to feed points corresponding to regions with different cavity heights, different frequency signals may be communicated via the same antenna. In another embodiment of the invention, a plurality of signals with different frequency may be communicated by the distributed leaky wave antenna 809E with regions of different frequency selectivity in the partially reflective surface defined by the metal layer 8091. The different frequencies may be harmonics of a feed signal to the distributed leaky wave antenna 809E. In this manner, a single feed signal may be utilized to generate a plurality of signals with different frequency communicated by the distributed leaky wave antenna 809E.

Figure 9:
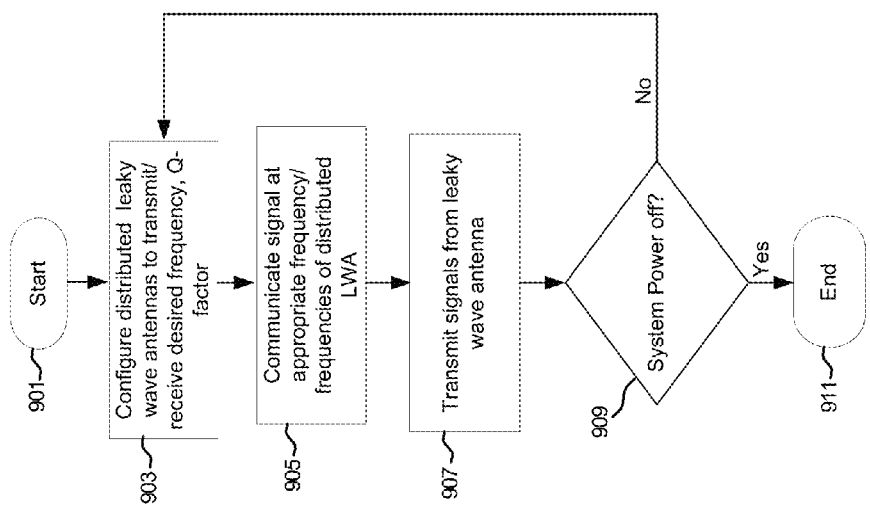
FIG. 9 is a block diagram illustrating exemplary steps for communicating via distributed leaky wave antennas, in accordance with an embodiment of the invention.

FIG. 9 is a block diagram illustrating exemplary steps for communicating via distributed leaky wave antennas, in accordance with an embodiment of the invention. Referring to FIG. 9, in step 903 after start step 901, one or more distributed leaky wave antennas may be configured to communicate wireless signals at different frequencies by configuring cavity heights and by coupling to RF power amplifiers of low noise amplifiers, for example. In step 905, high frequency signals at different frequencies may be communicated to feed points corresponding to sections of the distributed leaky wave antenna with a cavity height appropriate for the feed signal may be communicated to each section of the distributed leaky wave antenna. In another embodiment of the invention, a signal may be communicated to a plurality of feed points corresponding to sections of the distributed leaky wave antenna with different frequency selective surfaces. In step 907, signals at a plurality of frequencies may be communicated via the distributed leaky wave antennas. In step 909, in instances where the wireless device 150 is to be powered down, the exemplary steps may proceed to end step 911. In step 909, in instances where the wireless device 150 is not to be powered down, the exemplary steps may proceed to step 903 to configure the leaky wave antenna at a desired frequency.

In an embodiment of the invention, a method and system are disclosed for communicating RF signals at one or more frequencies via one or more distributed leaky wave antennas 164A-164C, 400, 420, 440, 460, 600, and 809A-809E in a wireless communication device 150. The one or more distributed leaky wave antennas 164A-164C, 400, 420, 440, 460, 600, and 809A-809E may be integrated in one or more multi-layer support structures 162, 167, and 171 in the wireless device 150. The RF signals may be communicated at the one or more frequencies via a plurality of cavity heights $h_1$-$h_5$ in the one or more distributed leaky wave antennas 164A-164C, 400, 420, 440, 460, 600, and 809A-809E or via a plurality of sections of the one or more distributed leaky wave antennas 164A-164C, 400, 420, 440, 460, 600, and 809A-809E with different partially reflective surfaces. The one or more multi-layer support structures 162, 167, and 171 may comprise an integrated circuit 162, an integrated circuit package 167, and/or a printed circuit board 171.

The one or more distributed leaky wave antennas 164A-164C, 400, 420, 440, 460, 600, and 809A-809E may be configured to transmit the RF signals at a desired angle from a surface of the one or more multi-layer support structures 162, 167, and 171. The one or more distributed leaky wave antennas 164A-164C, 400, 420, 440, 460, 600, and 809A-809E may comprise microstrip waveguides 720, In this regard, the plurality of cavity heights $h_1$-$h_5$ of the one or more distributed leaky wave antennas 164A-164C, 400, 420, 440, 460, 600, and 809A-809E may be configured based on distances between conductive lines 723 and 725 in the microstrip waveguides 720. The one or more distributed leaky wave antennas 164A-164C, 400, 420, 440, 460, 600, and 809A-809E may comprise coplanar waveguides 730 where the plurality of cavity heights $h_1$-$h_5$ of the one or more distributed leaky wave antennas 164A-164C, 400, 420, 440, 460, 600, and 809A-809E may be configured based on distances between conductive lines 731 and 733 in the coplanar waveguides. A beam shape of the communicated RF signals may be configured by tuning a frequency of a signal 401A-

401C communicated to the one or more distributed leaky wave antennas 164A-164C, 400, 420, 440, 460, 600, and 809A-809E.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for a distributed leaky wave antenna.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for communication, the method comprising:
communicating RF signals at one or more frequencies via one or more distributed leaky wave antennas in a wireless communication device, wherein said one or more distributed leaky wave antennas are integrated in one or more multi-layer support structures in said wireless device; and
adjusting a cavity height of at least one of said one or more distributed leaky wave antennas by causing a deflection of at least one reflective surface of the at least one of said one or more distributed leaky wave antennas to cause the at least one of said one or more distributed leaky wave antennas to transmit at least one of said RF signals in a plane of at least one of said one or more multi-layer support structures.

2. The method according to claim 1, comprising communicating said RF signals at said one or more frequencies via a plurality of cavity heights in said one or more distributed leaky wave antennas.

3. The method according to claim 1, comprising communicating said RF signals at said one or more frequencies via a plurality of sections of said one or more distributed leaky wave antennas with different partially reflective surfaces.

4. The method according to claim 1, wherein said one or more multi-layer support structures comprise one or more of: an integrated circuit, an integrated circuit package, and a printed circuit board.

5. The method according to claim 1, comprising configuring said one or more distributed leaky wave antennas to transmit said RF signals at a desired angle from a surface of said one or more multi-layer support structures.

6. The method according to claim 1, wherein said one or more distributed leaky wave antennas comprise microstrip waveguides.

7. The method according to claim 6, comprising controlling said plurality of cavity heights of said one or more distributed leaky wave antennas by adjusting distances between conductive lines in said microstrip waveguides.

8. The method according to claim 1, wherein said one or more distributed leaky wave antennas comprise coplanar waveguides.

9. The method according to claim 8, comprising controlling said plurality of cavity heights of said one or more distributed leaky wave antennas by adjusting distances between conductive lines in said coplanar waveguides.

10. The method according to claim 1, comprising configuring a beam shape of said communicated RF signals by tuning a frequency of a signal communicated to said one or more distributed leaky wave antennas.

11. A system for enabling communication, the system comprising:
one or more circuits disposed in a wireless device comprising one or more distributed leaky wave antennas,
wherein said one or more leaky wave antennas are integrated in one or more multi-layer support structures in said wireless device, and
the one or more circuits are further configured to adjust a cavity height of at least one of said one or more distributed leaky wave antennas by causing a deflection of at least one reflective surface of the at least one of said one or more distributed leaky wave antennas to cause the at least one of said one or more distributed leaky wave antennas to transmit RF signals in a plane of at least one of said one or more multi-layer support structures; and
said one or more circuits are operable to communicate said RF signals at one or more frequencies via said one or more distributed leaky wave antennas.

12. The system according to claim 11, wherein said one or more circuits are operable to communicate said RF signals at said one or more frequencies via a plurality of cavity heights in said one or more distributed leaky wave antennas.

13. The system according to claim 11, wherein said one or more circuits are operable to communicate said RF signals at said one or more frequencies via a plurality of sections of said one or more distributed leaky wave antennas with different partially reflective surfaces.

14. The system according to claim 11, wherein said one or more multi-layer support structures comprise one or more of: an integrated circuit, an integrated circuit package, and a printed circuit board.

15. The system according to claim 11, wherein said one or more circuits are operable to configure said one or more distributed leaky wave antennas to transmit said RF signals at a desired angle from a surface of said one or more multi-layer support structures.

16. The system according to claim 11, wherein said one or more distributed leaky wave antennas comprise microstrip waveguides.

17. The system according to claim 16, wherein said one or more circuits are operable to control said plurality of cavity heights of said one or more distributed leaky wave antennas by adjusting distances between conductive lines in said microstrip waveguides.

18. The system according to claim 11, wherein said one or more distributed leaky wave antennas comprise coplanar waveguides.

19. The system according to claim 18, wherein said one or more circuits is operable to control said plurality of cavity heights of said one or more distributed leaky wave antennas by adjusting distances between conductive lines in said coplanar waveguides.

20. The system according to claim 19, wherein said one or more circuits are operable to configure a beam shape of said communicated RF signals by tuning a frequency of a signal communicated to said one or more distributed leaky wave antennas.

* * * * *